(12) United States Patent
Yasuda

(10) Patent No.: US 7,566,654 B2
(45) Date of Patent: Jul. 28, 2009

(54) METHOD FOR MANUFACTURING A SEMICONDUCTOR DEVICE INCLUDING INTERCONNECTIONS HAVING A SMALLER WIDTH

(75) Inventor: Taizo Yasuda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 113 days.

(21) Appl. No.: 11/870,045

(22) Filed: Oct. 10, 2007

(65) Prior Publication Data
US 2008/0090409 A1   Apr. 17, 2008

(30) Foreign Application Priority Data
Oct. 11, 2006   (JP) .............................. 2006-277082

(51) Int. Cl.
*H01L 21/4763* (2006.01)
*H01L 21/461* (2006.01)
(52) U.S. Cl. ................. 438/643; 257/E21.495
(58) Field of Classification Search ............ 438/618, 438/643, 648; 257/774, E23.142, E21.495
See application file for complete search history.

(56) References Cited

U.S. PATENT DOCUMENTS 6,686,277 B1 *  2/2004  Tai .............................. 438/664

FOREIGN PATENT DOCUMENTS

| JP | 2002-134477 A | | 5/2002 |
|---|---|---|---|
| JP | 2002134477 A | * | 5/2002 |
| JP | 2002-217170 A | | 8/2002 |
| JP | 2002-252439 A | | 9/2002 |
| JP | 2003-100868 A | | 4/2003 |
| JP | 2003100868 A | * | 4/2003 |

* cited by examiner

*Primary Examiner*—Kiesha L Rose
*Assistant Examiner*—Aaron A Dehne
(74) *Attorney, Agent, or Firm*—Sughrue Mion, PLLC

(57) ABSTRACT

A method for manufacturing a semiconductor device includes the steps of forming an interconnection layer including a top tungsten layer, forming a mask pattern on the tungsten layer, nitriding a portion of the tungsten layer in a plasma nitriding process to form a tungsten nitride layer, etching the tungsten nitride layer while leaving the mask pattern on the tungsten layer, and patterning the interconnection layer by using the mask pattern as an etching mask.

7 Claims, 4 Drawing Sheets

METHOD FOR MANUFACTURING A SEMICONDUCTOR DEVICE INCLUDING INTERCONNECTIONS HAVING A SMALLER WIDTH

This application is based upon and claims the benefit of priority from Japanese patent application No. 2006-277082, the disclosure of which is incorporated herein in its entirety by reference.

BACKGROUND OF THE INVENTION (a) Field of the Invention

The present invention relates to a method for manufacturing a semiconductor device including interconnections having a smaller width and, more particularly, to a method for forming interconnections having a tungsten layer.

(b) Description of the Related Art

DRAM (dynamic random access memory) devices include an array of memory cells each for storing therein information. Each memory cell includes a MOSFET (metal-oxide-semiconductor field-effect-transistor) formed on a surface region of a silicon substrate and a storage capacitor overlying the MOSFET and connected thereto, and stores electric charge in the storage capacitor via the MOSFET.

Generally, DRAM devices include a plurality word lines formed on the silicon substrate with an intervention of a gate oxide film, and a plurality of bit lines overlying the word lines and extending perpendicularly thereto. The word lines control ON/OFF of the MOSFETs to receive, maintain or deliver the electric charge in the memory cell. The bit lines include a tungsten layer known as a low-resistivity metallic layer. Patent Publication JP-2002-134477A describes such a DRAM device.

In design of the conventional DRAM devices, the ratio of line width to line space of the interconnections, such as bit lines, is typically set at 1:1. Recently, a technique forming a sidewall oxide film on the side surface of the interconnections allows a via-plug connecting an overlaying interconnection to an underlying interconnection or silicon substrate to be formed between adjacent two of the interconnections, such as bit lines, in a self alignment manner. This technique necessitates reduction of the width of body of the interconnections, such as bit lines, from the conventional width by at least the thickness of the sidewall oxide film.

The line width of the bit lines, for example, is substantially at the lower limit restricted by the photolithographic technique, and it is generally difficult to drastically reduce the line width of bit lines as by improvement of the photolithographic technique.

SUMMARY OF THE INVENTION

In view of the above, it is an object of the present invention to provide a method for forming a semiconductor device having a smaller line width of interconnections.

The present invention provides a method for manufacturing a semiconductor device including consecutively: forming an interconnection layer overlying a substrate, the interconnection layer including a tungsten layer as a top layer thereof; forming a mask pattern on the tungsten layer; forming a tungsten nitride layer on a portion of the tungsten layer exposed from the mask pattern; etching the tungsten nitride layer while leaving the mask pattern on the tungsten layer; and patterning the interconnection layer by using the mask pattern as an etching mask to thereby form interconnections.

The above and other objects, features and advantages of the present invention will be more apparent from the following description, referring to the accompanying drawings.

PREFERRED EMBODIMENT OF THE INVENTION

Now, an exemplary embodiment of the present invention will be described with reference to accompanying drawings.

FIGS. 1A to 1E show a semiconductor device in consecutive steps of a process for manufacturing the semiconductor device according to an exemplary embodiment of the present invention. Before the step shown in FIG. 1A, the semiconductor device is subjected to several steps including the step of forming a STI (shallow trench isolation) structure on the surface portion of a silicon substrate to isolate device regions from one another. The step of forming the STI structure is followed by forming a gate electrode film and gate electrodes, and implanting impurities into the surface region of the silicon substrate in the device regions to form source/drain regions of MOSFETs. It is to be noted that the structure of MOSFETs is not depicted in FIGS. 1A to 1E, for the purpose of simplification of the drawings.

Figure 1A:
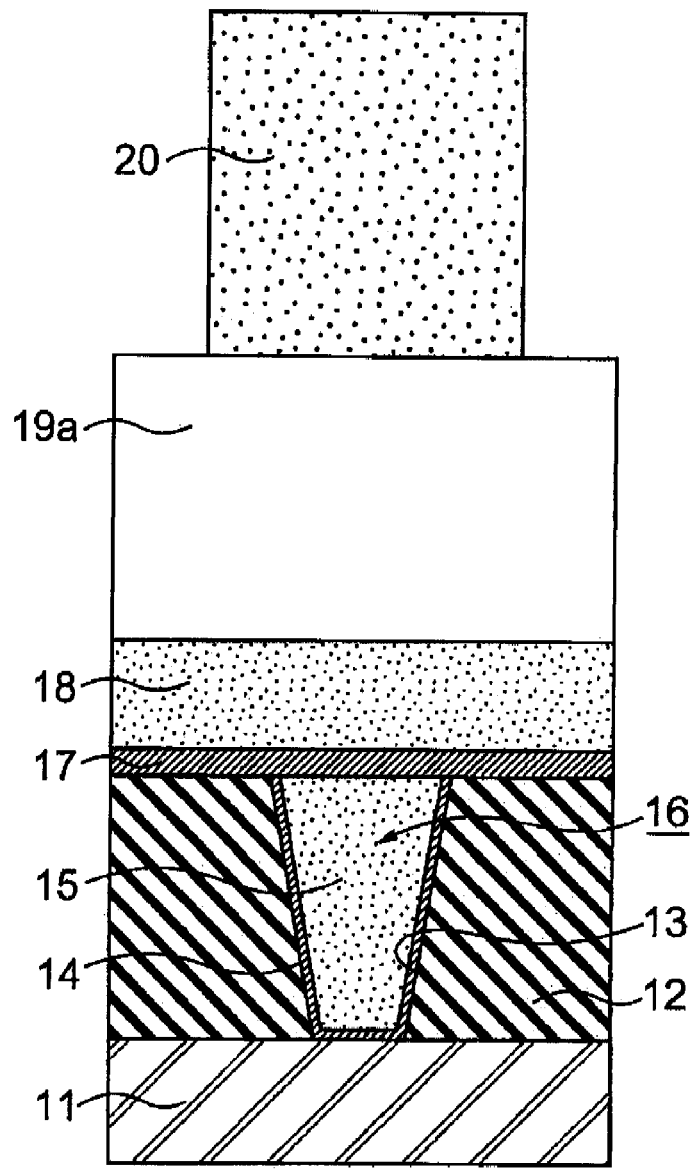
FIGS. 1A to 1E are sectional views of a semiconductor device, showing consecutive steps of a process for manufacturing the semiconductor device.

After washing the surface of the silicon substrate exposed from the gate electrodes by using an acid solution, silicon oxide is deposited using a CVD (chemical vapor deposition) technique to form an interlayer dielectric film 12 shown in FIG. 1A. The interlayer dielectric film 12 is then patterned to form contact holes 13 exposing therethrough a portion of the silicon substrate 11. Thereafter, a titanium nitride (TiN) film and a titanium (Ti) film are consecutively deposited to form a barrier metal layer 14 on the side surface of the contact holes 13 and on top of the interlayer dielectric film 12. A tungsten (W) layer 15 is then deposited to fill the contact holes 13 and on top of the silicon substrate 11 with an intervention of the barrier metal layer 14. Subsequently, a CMP (chemical-mechanical polishing) process is conducted to remove a portion of the tungsten layer 15 and the barrier metal layer 14 on top of the silicon substrate 11 to expose the interlevel dielectric film 12, thereby leaving contact plugs 16 including the barrier metal layer 14 and tungsten layer 15 within the contact holes 13 exposing therethrough the silicon substrate 11.

Subsequently, a tungsten nitride (WN) layer 17 having a thickness of about 10 nm and a tungsten (W) layer 18 having a thickness of about 60 nm are consecutively deposited on top of the interlayer dielectric film 12 and via-plugs 16. A silicon nitride film 19a having a thickness of about 140 nm is then deposited on the tungsten layer 18 by using a plasma CVD technique, followed by forming a photoresist film adapted to ArF excimer laser by a coating process on the silicon nitride film 19a. Thereafter, a photolithographic process is used to pattern the photoresist film to form a resist pattern 20 having a pattern shape corresponding to bit lines, to obtain the structure of FIG. 1A. The pattern width and pitch of the resist pattern 20 are 100 nm and 200 nm, respectively, for example.

Figure 1B:
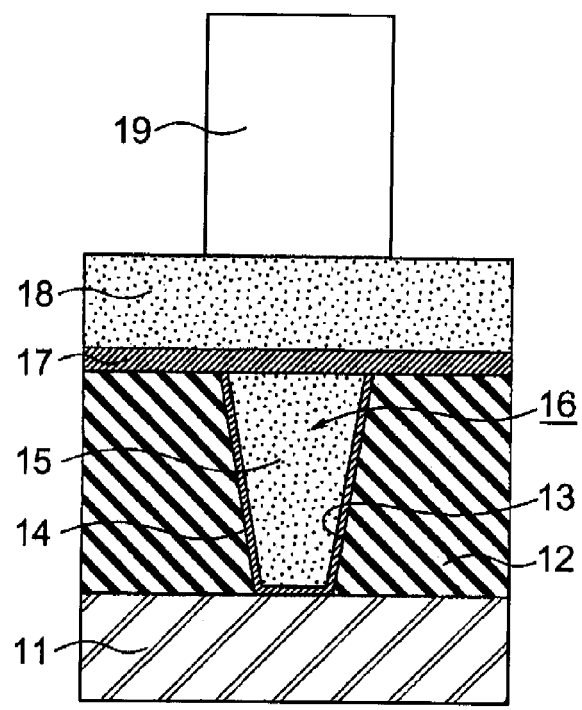

Subsequently, an anisotropic etching process using the resist pattern 20 as an etching mask is conducted onto the silicon nitride film 19a to form therefrom a hard mask 19 shown in FIG. 1B. The process for forming the hard mask 19 slightly reduces the width of the resist pattern 20 due to the side etch. The pattern width of the hard mask 19 is 65 nm, for example. The remaining resist pattern 20 is then removed using a plasma etching technique, to obtain the structure of FIG. 1B.

Subsequently, a plasma nitriding process is performed onto the tungsten layer 18 exposed from the hard mask 19, to form a tungsten nitride layer 21. The plasma nitriding process uses high-density plasma of $N_2$ within the chamber, to implant nitrogen ions in the plasma into the surface of tungsten layer 18 by using a RF power. The source gases of plasma include $N_2$ and He (helium), for example, and the source power and bias power are set at a higher value. The source power is set at 1000-1500 W, and the bias power is set at 100-300 W, for example.

Subsequently, an isotropic etching process is performed onto the tungsten nitride layer 21 by using the condition of a higher etch rate for the hard mask 19. This process reduces the width of the hard mask 19 due to slimming, as shown by numeral 23 of FIG. 1D, and also removes the tungsten nitride layer 21. This etching process uses gas plasma including $SF_6$, $Cl_2$, $N_2$, and Ar, a chamber pressure of 4-10 mTorr, a source power of 1000-1500 W, and a RF bias power of 0 W, for example.

Use of the gas plasma including the gases as described above increases the selective etch rate of silicon nitride with respect to tungsten nitride. The RF bias power is lowered to 0 W in order to improve the isotropic etching performance, and enhance the reduction in the width of the hard mask 19. The hard mask 19 reduces the width thereof down to 50 nm, for example.

Figure 1C:
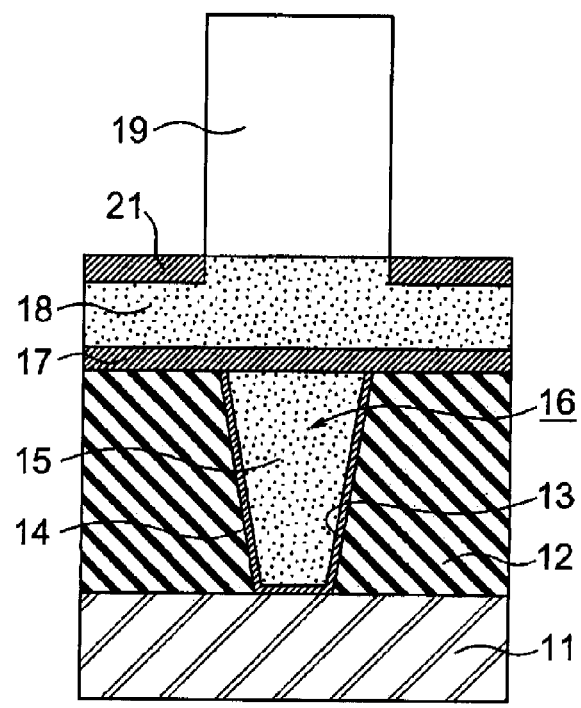
Figure 1D:
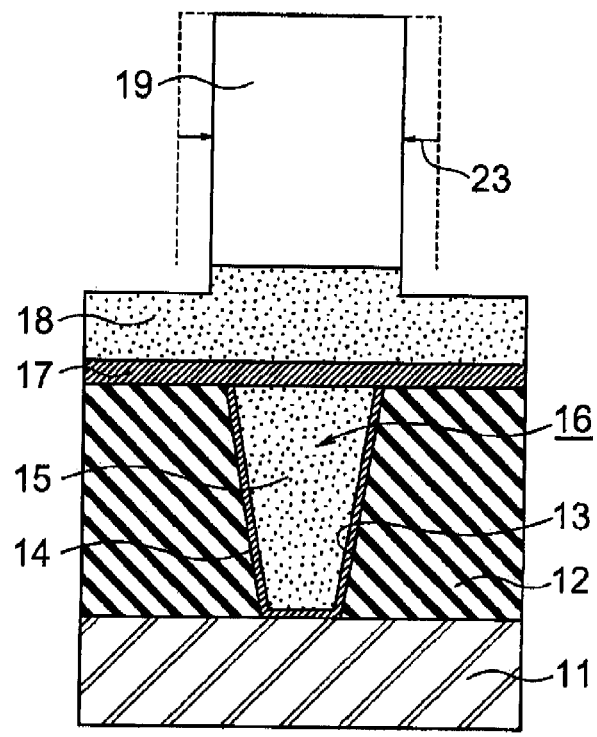
Figure 1E:
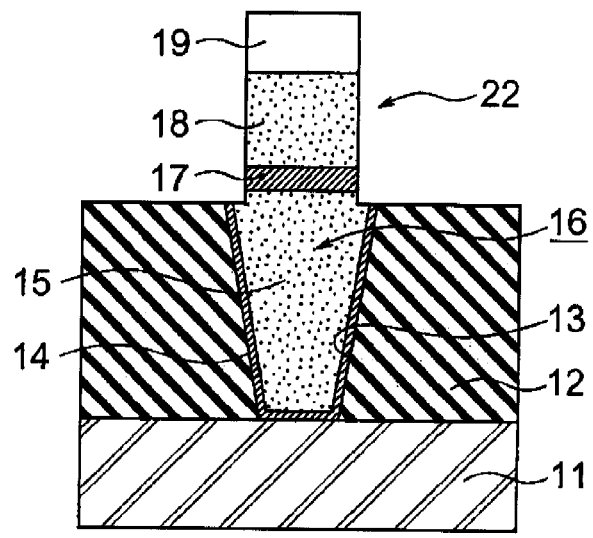

Thereafter, an anisotropic etching process using the hard mask 19 as an etching mask is performed, to pattern the tungsten layer 18, tungsten nitride layer 17, and the top portion of the interlayer dielectric film 12, as shown in FIG. 1E. The interlayer dielectric films 12 is etched in an amount of about 20 nm from the top thereof. This provides bit lines 22 including the tungsten nitride layer 17 and overlying tungsten layer 18. This anisotropic etching uses gas plasma including $CF_4$, $O_2$, $Cl_2$ and $N_2$ gases, a chamber pressure of 4 mTorr, source power of 1300 W and RF bias power of 80 W. This patterning using the hard mask 19 having a pattern width of 50 nm provides a width of 35 nm for the bit lines 22, for example.

In the present embodiment, the three steps shown in FIGS. 1C to 1E are performed in a common chamber. After the step of FIG. 1E, a silicon oxide film, such as a HDP (high-density-plasma) film, is deposited to cover the hard mask 19 and bit lines 22 on the interlevel dielectric film 12 by using a HDP-CVD process.

In the method of the present embodiment, the reduction of width of the hard mask 19 performed in advance of patterning the tungsten layer 18 and tungsten nitride layer 17 provides a smaller line width for the bit lines 22, which is smaller than the width restricted by the resolution limit of the photolithographic technique. In addition, formation of the tungsten nitride layer 21 on the surface of the tungsten layer 18 provides the reduction of the hard mask 19 without using the process of etching the tungsten layer 18.

The plasma nitriding process for nitriding the tungsten layer, as described above, may be replaced by a process of depositing a tungsten nitride layer on the tungsten layer 18. However, this increases the number of filming steps, and may increase the line resistance of the bit lines because the tungsten nitride layer deposited on the tungsten layer increases the ratio of the tungsten nitride layer to the bit lines to increase the sheet resistance thereof.

Another technique may be employed to reduce the width of the bit lines 22 without the slimming treatment of the hard mask 19 as described above, the another technique using a side-etching of the tungsten nitride layer 17, tungsten layer 18 and hard mask 19. Such a side-etching may be achieved by an increased time length of the over-etching during patterning the tungsten layer 18 and tungsten nitride layer 17 by using the hard mask 19 as an etching mask.

Figure 2:
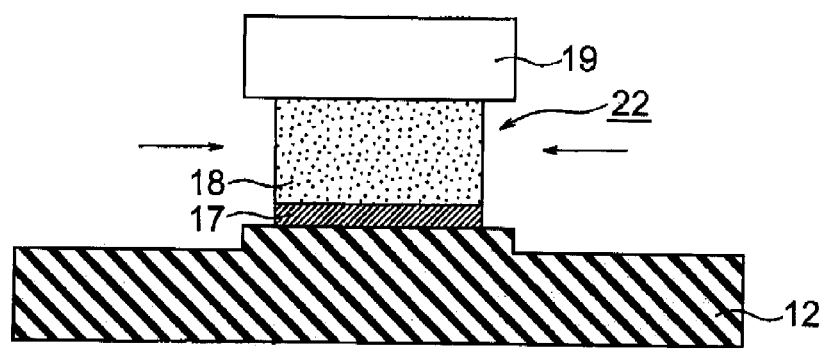
FIG. 2 is a sectional view showing a problem in a comparative example.

It is generally difficult, however, to equalize the etch rate in the side-etching of the tungsten layer 18 and the etch rate in the side-etching of the hard mask 19, and in general the tungsten layer 18 has a higher side-etching rate than the hard mask 19. FIG. 2 shows this situation after the side-etching of the tungsten layer 18 and the hard mask 19 as a comparative example, wherein the hard mask 19 overhangs the tungsten layer 18. This structure may incur the problems of disconnection due to collapse of the bit lines 22 and increased resistance due to the smaller line width. In addition, deposition of the HDP film covering the bit lines 22 may have therein a void adjacent to the side of the tungsten layer 18 due to an insufficient embedding performance.

In the method of the present embodiment, the reduction of width of the hard mask performed in advance of patterning the tungsten layer 18 and tungsten nitride layer 17 provides alignment of the side surfaces of the tungsten nitride layer, tungsten layer and hard mask, preventing the over-hanging structure or insufficient embedding performance of the deposition of the HDP film.

In the method of the present embodiment, the reduction of line width of the interconnections allows a smaller width of the overall structure of the bit lines including the sidewall oxide film, thereby simplifying the self-alignment process for forming the contact plugs or via-plugs.

In the present embodiment, the isotropic etching of the tungsten nitride layer deposited on the portion of the tungsten layer exposed from the mask pattern provides a reduction of the pattern width of the mask pattern while suppressing etching of the tungsten layer. Thus, a smaller line width can be achieved for the interconnections without incurring of the reduction in the thickness of the tungsten layer.

In the above embodiment, the etching of the tungsten nitride layer is performed in an isotropic etching condition providing a lower etch rate for said tungsten nitride layer than for said hard mask. This effectively reduces the pattern width of the mask pattern. The mask pattern may include silicon nitride, for achieving a higher etch selectivity of the mask pattern with respect to the tungsten nitride layer.

The barrier layer underlying the tungsten layer prevents diffusion of tungsten from the tungsten layer toward the underlying layer. The anisotropic plasma nitriding process for nitriding the tungsten layer provides a controllable thickness of the resultant tungsten nitride layer.

While the invention has been particularly shown and described with reference to exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. A method for manufacturing a semiconductor device comprising consecutively:

forming an interconnection layer overlying a substrate, said interconnection layer including a tungsten layer as a top layer thereof;

forming a mask pattern on said tungsten layer;

forming a tungsten nitride layer on a portion of said tungsten layer exposed from said mask pattern;

etching said tungsten nitride layer while leaving said mask pattern on said tungsten layer; and patterning said interconnection layer by using said mask pattern as an etching mask to thereby form interconnections.

2. The method according to claim 1, wherein said etching reduces a pattern width of said mask pattern.

3. The method according to claim 1, wherein said etching etches said tungsten nitride layer in an isotropic etching condition providing a power etch rate for said tungsten nitride layer than for said hard mask.

4. The method according to claim 3, wherein said mask pattern includes silicon nitride.

5. The method according to claim 1, wherein said interconnection layer includes a barrier layer underlying said tungsten layer.

6. The method according to claim 1, wherein said tungsten nitride layer forming includes nitriding said tungsten layer in a plasma nitriding process.

7. The method according to claim 1, wherein said tungsten nitride layer forming, said tungsten nitride layer etching and said interconnection layer patterning are conducted in a common chamber.

* * * * *